US010622838B2

(12) United States Patent
Valtysson

(10) Patent No.: US 10,622,838 B2
(45) Date of Patent: Apr. 14, 2020

(54) APPARATUS, SYSTEM AND METHOD FOR POWER EXTRACTION

(71) Applicant: LAKI POWER EHF., Kopavogur (IS)

(72) Inventor: Oskar H. Valtysson, Kopavogur (IS)

(73) Assignee: LAKI POWER EHF, Kopavogur (IS)

( * ) Notice: Subject to any disclaimer, the term of this patent is extended or adjusted under 35 U.S.C. 154(b) by 87 days.

(21) Appl. No.: 16/076,358

(22) PCT Filed: Feb. 13, 2017

(86) PCT No.: PCT/IS2017/050003
§ 371 (c)(1),
(2) Date: Aug. 8, 2018

(87) PCT Pub. No.: WO2017/138026
PCT Pub. Date: Aug. 17, 2017

(65) Prior Publication Data
US 2019/0044381 A1 Feb. 7, 2019

(30) Foreign Application Priority Data

Feb. 12, 2016 (IS) .......................................... 050143

(51) Int. Cl.
H02J 50/10 (2016.01)
H02J 7/02 (2016.01)
H04W 52/02 (2009.01)
H02J 50/00 (2016.01)
H02J 5/00 (2016.01)
H02M 1/44 (2007.01)
H02M 7/219 (2006.01)
G01R 19/25 (2006.01)

(52) U.S. Cl.
CPC .............. *H02J 50/10* (2016.02); *H02J 5/005* (2013.01); *H02J 7/025* (2013.01); *H02J 50/00* (2016.02); *H02M 1/44* (2013.01); *H02M 7/219* (2013.01); *H04W 52/0296* (2013.01); *G01R 19/2513* (2013.01)

(58) Field of Classification Search
CPC .. H02J 50/10; H02J 50/00; H02J 5/005; H02J 7/025; H02M 1/44; H02M 7/219; H04W 52/0296; G01R 109/2513
See application file for complete search history.

(56) References Cited

U.S. PATENT DOCUMENTS 9,188,610 B1 11/2015 Edel
2012/0176120 A1 7/2012 Jefferies
(Continued)

OTHER PUBLICATIONS

International Search Report and Written Opinion dated May 3, 2017 for corresponding International Application No. PCT/IS2017/050003.

*Primary Examiner* — Robet L Deberadinis
(74) *Attorney, Agent, or Firm* — Tarolli, Sundheim, Covell & Tummino LLP

(57) ABSTRACT

The present invention relates to extracting power from a current-carrying conductor's magnetic field and regulate to a stable DC voltage power source. The regulated DC voltage can be used to power the internal electronic circuitry of the power supply unit (PSU) and for powering external measurement devices and/or surveillance equipment's mounted into the device housing or onto the current-carrying conductors, such as phase wire, along with the PSU.

46 Claims, 11 Drawing Sheets

(56) References Cited

U.S. PATENT DOCUMENTS

2014/0266240 A1    9/2014    Haensgen et al.
2015/0028827 A1    1/2015    Peck, Jr.
2017/0199533 A1*  7/2017    McCollough ........... G05F 1/335

* cited by examiner

A

B

APPARATUS, SYSTEM AND METHOD FOR POWER EXTRACTION

RELATED APPLICATIONS

The present application is a U.S. National Stage application under 35 USC 371 of PCT Application Serial No. PCT/IS2017/050003, filed on 13 Feb. 2017; which claims priority from IS Patent Application No. 050143, filed 12 Feb. 2016, the entirety of both of which are incorporated herein by reference.

FIELD

The invention relates to the field of power extraction. More precisely, the invention relates to extracting power from conductors. Even more precisely, the invention relates to extracting power from a current-carrying conductor's magnetic field.

INTRODUCTION

Power lines are used throughout the world to transport electrical energy. Power lines often carry large currents, often as alternating currents. Such currents give rise to changing magnetic fields. A conductor placed in a changing magnetic field will experience a force resulting in electromagnetic induction. Thus, by placing conductors in the vicinity of power lines, one can extract power directly from the line without physical contact. This principle is often used to power small monitoring and diagnostic devices throughout the power line.

Currently existing devices can usually extract very little usable power from the power line. Furthermore, they often require a period of collecting and storing power before they can power on. Once enough power has been gathered, such devices wake up, perform the predetermined measurements, sometimes send them wirelessly to a control centre and power down.

US patent application 2010/0084920 A1 describes a current transforming harvester ("CTH") capable of producing power from a conductor on a pre-existing power grid without alteration of the conductor or the pre-existing power grid. The CTH includes a current transformer ("CT") that captures energy via magnetic flux from the conductor. The CT is substantially circular and includes two halves called a "split core," which allow the CT to easily attach to the conductor without opening the circuit in which the conductor operates. A clamping mechanism of the CTH may secure the CTH to the conductor via a pair of spring-biased clamp pads. The CTH includes circuitry that converts the magnetic flux energy captured by the CT into electrical energy suitable for consumption by an electrical device.

US patent application 2014/0266240 A1 discloses a harvesting and measurement device operable in at least a normal operation mode, a demand measurement mode, and a fault measurement mode. In the normal operation mode, the device is able to harvest energy from an associated power line and monitor current and voltage conditions through a lower power circuit. In the demand measurement mode, harvesting elements of the circuit are disabled so as not to interfere with accuracy of demand current measurements. In the fault measurement mode, one or more Hall sensors are activated such that high currents can be accurately measured.

US patent application US 2015/0326136 A1 describes a magnetic field energy harvesting device that may include an inductor and a controller. The inductor may include two inductor windings connected to each other in series, configured in winding directions and orientations to generate two voltages relative to the middle tap of inductor and out of phase with each other. The controller may switch the two voltages and may generate an approximately constant DC output voltage by alternating switching on and off switches.

While the prior art system may be satisfactory in some instances, they also have certain drawbacks and disadvantages. For example, with the prior art system, it may not be possible to extract large amounts of power from the conductor. Further still, it may be impossible or at least difficult to control how much power is extracted from the conductor.

SUMMARY

In light of the above, it is an object to overcome or at least alleviate the disadvantages and shortcomings of the prior art. In particular, it may be an object of the present invention to provide a technology allowing the extraction of power from a conductor conducting a current, and in particular allowing a great amount of power to be extracted in a controlled manner. These objects are met by the present invention.

The present invention is specified in the claims as well as in the below description. Preferred embodiments are particularly specified in the dependent claims and the description of various embodiments.

The above features along with additional details of the invention, are described further in the examples below, which are intended to further illustrate the invention but are not intended to limit its scope in any way.

The apparatus, the system and the device of the present invention provide a new and improved method of extraction of power from a conductor conducting a current. In some embodiments of the present invention, the following features may be employed: a) using multiple secondary windings without connecting them directly together, b) excluding windings from the power generation by shunting, and/or c) using MOSFET transistors, e.g., to ensure efficient and "cold" power regulation. These features may provide a new and improved solution. The method of using multiple secondary windings without connecting them directly together may be advantageous with regards to power harvesting efficiency. By using for example three secondary windings (one base winding and two shunt windings each generating 10 VA at certain phase wire current) their summed power generation will be 30 VA if the summing happens after the rectification bridges, not before. This may be advantageous for the harvesting efficiency of the apparatus and the high power generation capabilities compared to other inventions or available solutions of prior art methods. Furthermore, the method of shunting secondary windings dynamically for the purpose of regulating the power generation of the apparatus may be another advantage of embodiments of the invention. By totally shunting the shunt windings not needed each time may prevent heat generation and overvoltage transients and may ensure stable power generation. Other inventions use different methods; most often they include the wasting of excessive power as heat. The method of using MOSFET transistors for the rectification, and as a shunt for the shunt windings, may be another advantage of embodiments of the present invention. Other solutions use conventional diodes or Schottky diodes for rectification, incurring considerable power losses and heat generation.

In a first aspect, the invention describes an apparatus adapted to extract power from an alternating current carrying conductor's magnetic field comprising at least one transformer core adapted to be placed all the way around the alternating current carrying conductor, and at least two secondary windings wound around the at least one transformer core wherein the first secondary winding is a base winding that comprises a variable resistive load adapted to be adjusted based on the voltage across the apparatus.

Such an apparatus may allow to extract a substantial amount of power from a current carrying conductor, such as a power line. Furthermore, depending on the harvested voltage, it may also control how much power is extracted. It may thus meet the above described objects.

The current carrying conductor can preferably be a phase wire of a power line. This phase wire can be overhead or an underground (buried) one. The transformer core or cores around which the secondary winding are wound can be of circular, square, elliptical and/or other shapes as long as the core forms a complete closed loop around the current carrying conductor.

In the present context the core or cores can be split core type or non-split (solid) core type.

In the present context the terms "base winding" and "pilot winding" refer to the same item as is explained here below.

In the present context the terms "shunt winding" and "non-pilot winding" refer to the same item as is explained here below.

In the present context both base windings (pilot windings) and shunt windings (non-pilot windings) are identical secondary windings in a current transformer configuration and can share the same transformer core or each have their own separate transformer core. For further clarification: there is only "one" base winding per apparatus but the shunt windings are always one or more. The power generation of the "base winding" is never interrupted but the power generation of the "shunt windings" can be interrupted, that is to say, they can be completely turned off by "shunting" them one by one when needed for the purpose of regulating the power harvesting of the apparatus. The base and shunt windings are never and may never be directly connected together, neither in parallel nor in serial configuration. It's not until after the rectification bridges that the regulated power is summed together.

The base secondary winding and each of the shunt secondary windings may be part of their own rectification circuits. Furthermore, all together they may be part of the larger regulation and power summing circuit.

The base secondary winding regulation and rectification circuit may comprise the base winding, a DC voltage level detector (one detector can be part of multiple regulation and rectification circuits, i.e. only one such detector is needed for the whole apparatus) that can measure the DC voltage across the circuit, a zero crossing detector, an AC voltage zero crossing controlled circuit status latch, and a MOSFET-based rectifying bridge with smoothing and filtering capacitors.

The base secondary winding may provide power for the basic electronic circuitry, i.e. the analog and control logic, the zero crossing detector and other components. Aside from that, the base secondary winding may contribute to the power generation. Unlike the shunt secondary windings, which may be shunted, the base winding is never shunted. If the DC voltage level within the circuit needs to be limited, the control logic may use a pulse width modulated resistive load regulation on the base winding. The modulated resistance can be based on a fixed load resistance value of 1-10 ohms, more preferably a fixed value of 2-5 ohms, even more preferably a fixed value of 2.2 ohms and can vary from 0 to 100% of the fixed load value. That is, in this embodiment, the shunt secondary windings may be shunted and thereby the power extraction may be controlled, while the power extraction by means of the base secondary winding may be controlled by means of the variable resistive load. Again, this may allow for a convenient and apt control of the power extracted by means of the described apparatus. Furthermore, this can increase the fail-safety of the system, since shunting the shunt secondary windings allows to safely reduce the voltage across the apparatus and to avoid voltage spikes that can lead to damage in various components of the apparatus.

The shunt secondary winding regulation and rectification circuit may comprise the shunt secondary winding, a DC voltage level detector (one detector can be part of multiple regulation and rectification circuits, i.e. only one such detector is needed for the whole apparatus) that can measure the DC voltage across the circuit, a zero crossing detector, an AC voltage zero crossing controlled circuit status latch, an optically isolated MOSFET driver and a blocking MOSFET, and a MOSFET-based rectifying bridge with smoothing and filtering capacitors.

Each of the shunt secondary windings can be shunted using the blocking MOSFETs. If the voltage level within the circuit rises, the control logic can shunt the shunt secondary windings one by one, preferably automatically and/or dynamically. In a preferred embodiment, the apparatus comprises five shunt secondary windings. Once all five have been shunted, the base winding is controlled using the pulse width modulated resistive load. In this way, the apparatus is protected from sudden voltage rise. This is particularly advantageous, as voltage spikes can otherwise lead to damage in the various electronic components. The base winding also provides the zero crossing detection enabling the DC voltage level status latch to turn the MOSFET current shunts on and off in the zero crossing state of the current transformer, thus minimizing possible voltage spikes generated across the MWCT (Multiple Winding Current Transformer) windings.

Each winding may have its own rectification circuitry (MOSFET rectification bridge and smoothing capacitors). The apparatus may comprise only one power and voltage regulation circuit (voltage level detection, MOSFET shunting control and Pulse Width Modulation (PWM) load regulation)

In a preferred embodiment, the apparatus may be adapted to operate with induced AC voltage of 9-50 V, more preferably 12-35 V. In such preferred embodiment, the first shunt secondary winding can be shunted when the voltage exceeds 25 V with subsequent shunt secondary windings being shunted stepwise and the variable resistance for the base secondary winding kicking in at last to ensure that 35 V is not exceeded.

Using conventional methods (such as diodes) when rectifying AC voltage to DC voltage can impose considerable power losses due to the inherent silicon voltage drop across diodes in the rectification bridges. This specially applies at low voltage levels and high currents. To avoid this, the disclosed apparatus may be outfitted with MOSFET transistors instead of diodes in the rectification bridges. When fully conducting, the MOSFET transistors impose negligible series resistance instead of the relatively large silicon voltage drop that conventional diodes do and therefore almost eliminate power losses due to silicon voltage drops and the associated heat generation.

MOSFET transistors may also be used as current shunts for the MWCT windings and for all other high current switching circuits in the apparatus. This may be advantageous bearing in mind that the electronic circuit boards of the PSU are located in a confined non-ventilated compartment inside the PSU. Therefore, the use of MOSFET transistors with ultra-low RDS-on (ultra-low Drain to Source resistance) values for intensive current switching may be advantageous for keeping the heat generation inside the PSU at a minimum but the power efficiency at the maximum. In other words, using MOSFET transistors can help avoid overheating and subsequent damage to the equipment.

The base resistance for the variable resistive load can comprise 1 to 10 ohms, more preferably 1 to 4.7 ohms.

The power extracting apparatus can be adapted to deliver a direct current output. This can be particularly advantageous for directly using the extracted power for various measuring, diagnostics and/or communication devices.

The power extracting apparatus can be adapted to deliver an average of 30 to 100 watts as an output, preferably 50 to 70 watts, when the current carrying conductor carries an average of 100 to 1500 A, such as 200 A. That can be the typical current range for power lines. Such a power output is increased compared to the output known in the prior art. The present invention achieves it by using a plurality of windings and efficient rectifying of the power based on preferably MOSFET transistors. In other words, the large power output enabled by the invention can be particularly advantageous compared to previously known methods of power extraction from power lines.

The rectifying bridges behind each secondary winding (including the base winding and one or a plurality of shunt secondary windings) can be connected in parallel.

Advantages in paralleling (summing) the rectified power from the shunt and base windings may include the effective power harvesting and power control of the device. And this may be achieved without having to waste excess power in heat.

All windings may contribute to the power harvesting if the current in the phase wire is low but the need for power output is high. If the phase wire current is high, but the need for power output is low, shunt windings are dynamically excluded from the power harvesting by the method of completely shunting them. If current in the phase wire goes above the specified maximum amperage level the PWM kicks in adjusting the DC voltage level within the device.

In a second aspect, the invention describes an apparatus adapted to extract power from a current carrying conductor's magnetic field comprising a base winding adapted to contribute to power generation; at least one shunt winding adapted to contribute to the power generation; a common DC voltage level detection for regulated and rectified DC voltage; a zero crossing detector; an AC voltage zero crossing controlled circuit status latch; an optically isolated MOSFET driver and a blocking MOSFET for each of the at least one shunt windings; and a MOSFET-based rectifying bridge with smoothing and filtering capacitors for the base winding and for each of the at least one shunt windings. The base winding is adapted to provide power for the analog and control logic and the zero crossing detector along with contributing to the power harvesting of the apparatus.

This second aspect can use any and all feature described in the first aspect of the invention. It will be understood that the second aspects typically has advantages corresponding to the advantages discussed above.

In a third aspect, the apparatus may be part of a system adapted to extract power from a current carrying conductor's magnetic field and use it for at least powering itself. The system comprises a Power Harvesting Section (PHS) adapted to extract power from a magnetic field of an alternating current conductor while located in the proximity of said conductor, wherein the PHS converts the generated current from alternating (AC) to direct (DC) voltage; a Control and Supervisory Section (CSS) adapted to receive and send data related to technical parameters of the system from the PHS, store this data and make decisions based on the values of certain technical parameters; and an Output and Telecom Section (OTS) adapted to convert voltage incoming from the PHS for any external devices connected to the system and to communicate wirelessly with devices outside of the system via a communication module.

In this aspect, the apparatus as described in the first and second aspects can be part of the Power Harvesting Section (PHS).

In a preferred embodiment, the system can have a total weight of 15-30 kg, more preferably 15-25 kg, even more preferably 15-20 kg. That is, the system may be relatively compact and simple to use and install on overhead and/or underground power lines. The system can be adapted to extract an average of 30-100 watts, more preferably 40-80 watts, even more preferably 50-70 Watts from a phase wire with an average current of 100-1500 A, preferably 100-1200 A, or more preferably 100-600 A, or 100-300 A. As mentioned above, this can present a significant increase in power extracted from a power line. The system can be adapted to induce an AC voltage of 9-50 V, more preferably 9-40 V, even more preferably 12-35 V from the phase wire.

In a preferred embodiment, the PHS may comprise at least a Multiple Winding Current Transformer (MWCT) module, a DC/DC regulation module and a charging control module. The MWCT module can be as described in the first and second aspects. That is, the MWCT module can comprise at least two secondary windings around at least one transformer core. The core can be adapted to be placed around the alternating current carrying conductor, such as a power line. The MWCT module can further comprise any of the features and/or components described in connection with the first and second aspects above.

The charging control module can be connected to a reserve battery. The DC/DC regulation module can be connected to the CSS. The PHS can be a self-sufficient part of the system—all of the internal controls are contained within it. Among other things, the PHS can control the shunting of the shunt secondary windings and the variable load resistance of the base winding based on the voltage reading across the circuit.

In preferred embodiments, the CSS and the OTS can be used to distribute the generated DC power throughout the system, to power any external devices connected to the system, to take measurements of certain technical parameters of the system and/or of the power line and its surroundings, and/or to communicate with external devices wirelessly via a GSM module.

The CSS can comprise at least a primary controller, a power management controller and a measurement and data acquisition module. The CSS can be responsible for controlling the system as a whole, for distributing the power harvested, and/or for measuring and recording various technical parameters. The technical parameters can be temperature, acceleration (and/or tilt), cell load (weight), current, voltage and/or other parameters. In this way, the system can be used to serve as a diagnostic device for the phase wire, imaging means for surrounding surveillance, such as high resolution cameras.

The OTS can be used to transmit power to any external devices connected to the system and/or to communicate wirelessly via a GSM module. The OTS can transmit parameters acquired by the CSS to external devices. This can be particularly advantageous for transmitting the diagnostics measured values from the power line to a control or maintenance centre. In this way, the power line can be remotely monitored using the described system.

In a fourth aspect, a method of harvesting electrical power efficiently from an AC current carrying conductor making use of the above aspects is provided. The method can make use of any features of the apparatus and of the system listed above and below. The method comprises placing at least one transformer core around an AC current carrying conductor and winding at least two secondary windings around the at least one transformer core, wherein a first secondary winding is the base winding; providing a variable resistive load for the base secondary winding adapted to increase or decrease the load depending on the voltage level across the circuit; providing a shunting mechanism for each shunt secondary winding adapted to short the secondary winding if the voltage across the circuit reaches a certain pre-set value; and converting the power harvested from the AC current carrying conductor into DC power.

In a preferred embodiment, the above method can also comprise the steps of using the harvested power to monitor and/or store technical parameters of the circuit and/or of the AC current carrying conductor (preferably the power line), and sending the technical parameters wirelessly and receiving commands wirelessly over a communication module.

The technical parameters can comprise time stamped temperature data, acceleration and/or tilt data, cell load or weight data and/or other circuit related parameters such as still images and/or video streams.

The shunting mechanism can comprise MOSFET transistors featuring ultra-low RDS-on (ultra-low Drain to Source resistance). Such transistors can minimize power losses and heat generation, which can be particularly advantageous for maximizing the extracted power and/or avoiding overheating within the system.

The present invention is also defined by the following numbered embodiments.

1. An apparatus adapted to extract power from an alternating current carrying conductor's magnetic field comprising
   a) at least one transformer core adapted to be placed all the way around the alternating current carrying conductor; and
   b) at least two secondary windings wound around the at least one transformer core wherein the first secondary winding is a base secondary winding wherein the base winding comprises a variable resistive load adapted to be adjusted based on a voltage across the apparatus.
2. An apparatus according to embodiment 1 wherein the transformer core and/or cores are of a circular, square, elliptical and/or other shapes and form(s) a closed loop for the alternating magnetic field surrounding the alternating current carrying conductor.
3. An apparatus according to any of the preceding embodiments wherein the base secondary winding and each of the shunt secondary windings are part of their own rectification circuit and are all together part of the larger power and voltage regulation circuit.
4. An apparatus according to the preceding embodiment wherein the regulation and rectification circuit comprises a base secondary winding or a shunt secondary winding, a common DC voltage level detector for the regulated and rectified DC voltage, a zero crossing detector, an AC voltage zero crossing controlled circuit status latch, an optically isolated MOSFET driver and a blocking MOSFET for each of the at least one shunt secondary windings and a MOSFET-based rectifying bridge with smoothing and filtering capacitors for the base winding and for each of the at least one shunt secondary windings.
5. An apparatus according to the preceding embodiment wherein the shunt secondary windings are adapted to be shunted using the MOSFET current shunt that is a part of the power and voltage regulation circuit when the voltage across the apparatus exceeds a certain pre-set value.
6. An apparatus according to the preceding two embodiments wherein the use of MOSFET transistors featuring ultra-low RDS-on (ultra-low Drain to Source resistance) minimizes power losses and heat generation within the apparatus.
7. An apparatus according to any of the preceding embodiments wherein the base resistance for the variable resistive load is 1-10 ohms, more preferably 1-4.7 ohms.
8. An apparatus according to any of the preceding embodiments, wherein the apparatus is adapted to deliver a direct current output.
9. An apparatus according to any of the preceding embodiments, wherein the apparatus is adapted to deliver an average of 30 to 100 watts as an output, preferably 50 to 70 watts, when the current carrying conductor carries an average of 100 to 1500 A, such as 200 A.
10. An apparatus according to any of the preceding embodiments wherein the rectifying bridges are connected in parallel.
11. An apparatus adapted to extract power from an alternating current carrying conductor's magnetic field comprising
    a) a base winding adapted to contribute to power generation; and
    b) at least one shunt secondary winding adapted to contribute to the power generation; and
    c) a common DC voltage level detector for regulated and rectified DC voltage; and
    d) a zero crossing detector; and
    e) an AC voltage zero crossing controlled circuit status latch; and
    f) an optically isolated MOSFET driver and a blocking MOSFET for each of the at least one shunt secondary windings; and
    g) a MOSFET-based rectifying bridge with smoothing and filtering capacitors for the base winding and for each of the at least one shunt secondary windings wherein the base winding is adapted to provide power for the analog and control logic and the zero crossing detector.
12. An apparatus according to embodiment 11 further comprising at least one transformer core around which the primary and the at least one secondary windings are wound wherein the transformer core is of a circular, square, elliptical and/or other shapes and forms a closed loop for the alternating magnetic field surrounding the alternating current carrying conductor.
13. An apparatus according to any of the embodiments 11 to 12 wherein the shunt secondary windings are adapted to be shunted using the blocking MOSFET that is a part of a voltage regulation circuit when the voltage across the apparatus exceeds a certain preset value.
14. An apparatus according to any of the embodiments 11 to 13 wherein the use of MOSFET transistors featuring ultra-low RDS-on (ultra-low Drain to Source resistance) minimizes power losses and heat generation within the apparatus.
15. An apparatus according to any of embodiments 11 to 14, wherein the apparatus is adapted to deliver a direct output current (DC).

16. An apparatus according to any of the embodiments 11 to 15, wherein the apparatus is adapted to deliver an average of 30 to 100 watts as an output, preferably 50 to 70 watts, when the current carrying conductor carries an average of 100 to 1500 A, such as 200 A.
17. An apparatus according to any of the preceding embodiments wherein the rectifying bridges are connected in parallel.
18. A system adapted to extract power from an alternating current carrying conductor's magnetic field and use it for at least powering itself comprising
    a) a Power Harvesting Section (PHS) adapted to extract power from a magnetic field of the alternating current carrying conductor while located in the proximity of said conductor wherein the PHS is adapted to convert the generated current from alternating (AC) to direct (DC); and
    b) a Control and Supervisory Section (CSS) adapted to receive and send data related to technical parameters of the system from the PHS, store this data and make decisions based on the values of certain technical parameters; and
    c) an Output and Telecom Section (OTS) adapted to convert voltage incoming from the PHS for any external devices connected to the system and to communicate wirelessly with devices outside of the system via a communication module.
19. A system according to embodiment 18, further comprising auxiliary circuits adapted to measure temperature, acceleration (tilt), and/or cell load (weight) within the system and/or within the alternating current carrying conductor.
20. A system according to any of the preceding embodiments 18 to 19 weighting a total of 15-30 kg, more preferably 15-25 kg, even more preferably 15-20 kg.
21. A system according to any of the preceding embodiments 18 to 20 adapted to extract an average of 30-100 watts, more preferably 40-80 watts, even more preferably 50-70 watts from a phase wire with an average current value of 100-1500 A.
22. A system according to any of the preceding embodiments 18 to 21 adapted to induce an AC voltage of 9-50 V, more preferably 9-35 V from the phase wire.
23. A system according to any of the preceding embodiments 18 to 22 wherein the PHS comprises at least a Multiple Winding Current Transformer (MWCT) module, a DC/DC regulation module and a charging control module.
24. A system according to the preceding embodiment wherein the MWCT module comprises at least two secondary windings around at least one transformer core that is itself placed around the alternating current carrying conductor.
25. A system according to the preceding embodiment wherein the first secondary winding is a base winding further comprising a variable resistive load adapted to be adjusted based on the voltage across the system.
26. A system according to the preceding embodiment wherein the base resistance for the variable load is 1-10 ohms, more preferably 1-4.7 ohms.
27. A system according to the preceding three embodiments wherein the base winding and each of the at least one shunt secondary windings are part of their own rectification circuit and are all together part of a larger power and voltage regulation circuit.
28. A system according to the preceding embodiment wherein the regulation and rectification circuit comprises a common DC voltage level detector, an AC voltage zero crossing detector, a synchronized circuit status latch, a MOSFET current shunt, a MWCT winding, and a MOSFET based rectification bridge with smoothing and filtering capacitors.
29. A system according to the preceding embodiment wherein the MOSFET current shunt is adapted to shunt the shunt secondary winding if the voltage exceeds a certain pre-set value.
30. A system according to any of the preceding two embodiments wherein the rectification bridge uses MOSFET transistors featuring ultra-low RDS-on (ultra-low Drain to Source resistance) minimizing power losses and heat generation within the apparatus.
31. A system according to the preceding embodiment and with the features of embodiment 25 wherein the PHS is adapted to control shunting of the shunt secondary windings and the variable load of the base winding based on the voltage reading across the system.
32. A system according to any of the preceding embodiments 18 to 31 and with feature of embodiment 24 wherein the rectifying bridges are connected in parallel.
33. A system according to any of the preceding embodiments 18 to 32 wherein the CSS comprises at least a primary controller, a power management controller and a measurement and data acquisition module.
34. A system according to the preceding embodiment wherein the power management controller is adapted to distribute the converted DC power to other elements of the system such as the OTS.
35. A system according to any of the preceding embodiments 18 to 34 wherein the communication module of the OTS section comprises a GSM module for wireless communication.
36. A system according to any of the preceding embodiments 18 to 35 further adapted to connect to external measurement devices and/or surveillance devices that can then be powered with the harvested power through the OTS section.
37. A system according to any of the embodiments 18 to 36, wherein the apparatus is adapted to deliver a direct output current.
38. A power line system comprising the system according to any one of embodiments 18 to 37 and a power line as the alternating current carrying conductor.
39. The power line system according to the preceding embodiment, wherein the power line is an overhead and/or a buried power line.
40. A method of harvesting electrical power from an alternating current carrying conductor embodiment comprising the steps of
    a) placing at least one transformer core around the alternating current carrying conductor and winding at least two secondary windings around the at least one transformer core, wherein a first secondary winding is a base winding and the other secondary windings are shunt secondary windings; and
    b) providing a variable resistive load for the base secondary winding adapted to increase or decrease the load depending on a voltage level; and
    c) providing a shunting mechanism for each shunt secondary winding adapted to short the secondary winding if the voltage level reaches a certain pre-set value; and
    d) converting the power harvested from the alternating current carrying conductor into DC power.
41. A method according to embodiment 40 further comprising the following steps e) using the harvested power to monitor and/or store technical parameters of the circuit and/or of the alternating current carrying conductor; and f) sending the technical parameters wirelessly and receiving commands wirelessly over a communication module.

42. A method according to the preceding embodiment wherein the technical comprise time stamped temperature data, acceleration and/or tilt data, cell load or weight data and/or other circuit related parameters.

43. A method according to any of the preceding embodiments 40 to 42 wherein the shunting mechanism comprises MOSFET transistors featuring ultra-low RDS-on (ultra-low Drain to Source resistance) that may minimize power losses and heat generation.

44. A method according to any of the preceding embodiments 40 to 43 wherein converting the AC power to DC power is achieved via a MOSFET-based rectification circuit, which may be adapted to minimize voltage drops and power losses across the circuit.

45. A method according to any of the preceding embodiments 40 to 44 wherein the base resistance is 1-10 ohms, more preferably 1-4.7 ohms.

46. A method according to any of the preceding embodiments 40 to 45 wherein the rectifying bridges are connected in parallel.

47. A method in accordance with any of the embodiments 40 to 46, wherein the method utilizes the apparatus according to any one of embodiments 1 to 17 or a system according to any one of embodiments 18 to 39.

BRIEF DESCRIPTION OF THE DRAWINGS

The skilled person will understand that the drawings, described below, are for illustration purposes only. The drawings are not intended to limit the scope of the present teachings in any way.

DESCRIPTION OF VARIOUS EMBODIMENTS

In the following, exemplary embodiments of the invention will be described, referring to the figures. These examples are provided to provide further understanding of the invention, without limiting its scope.

In the following description, a series of features and/or steps are described. The skilled person will appreciate that unless required by the context, the order of features and steps is not critical for the resulting configuration and its effect. Further, it will be apparent to the skilled person that irrespective of the order of features and steps, the presence or absence of time delay between steps, can be present between some or all of the described steps.

Figure 1:
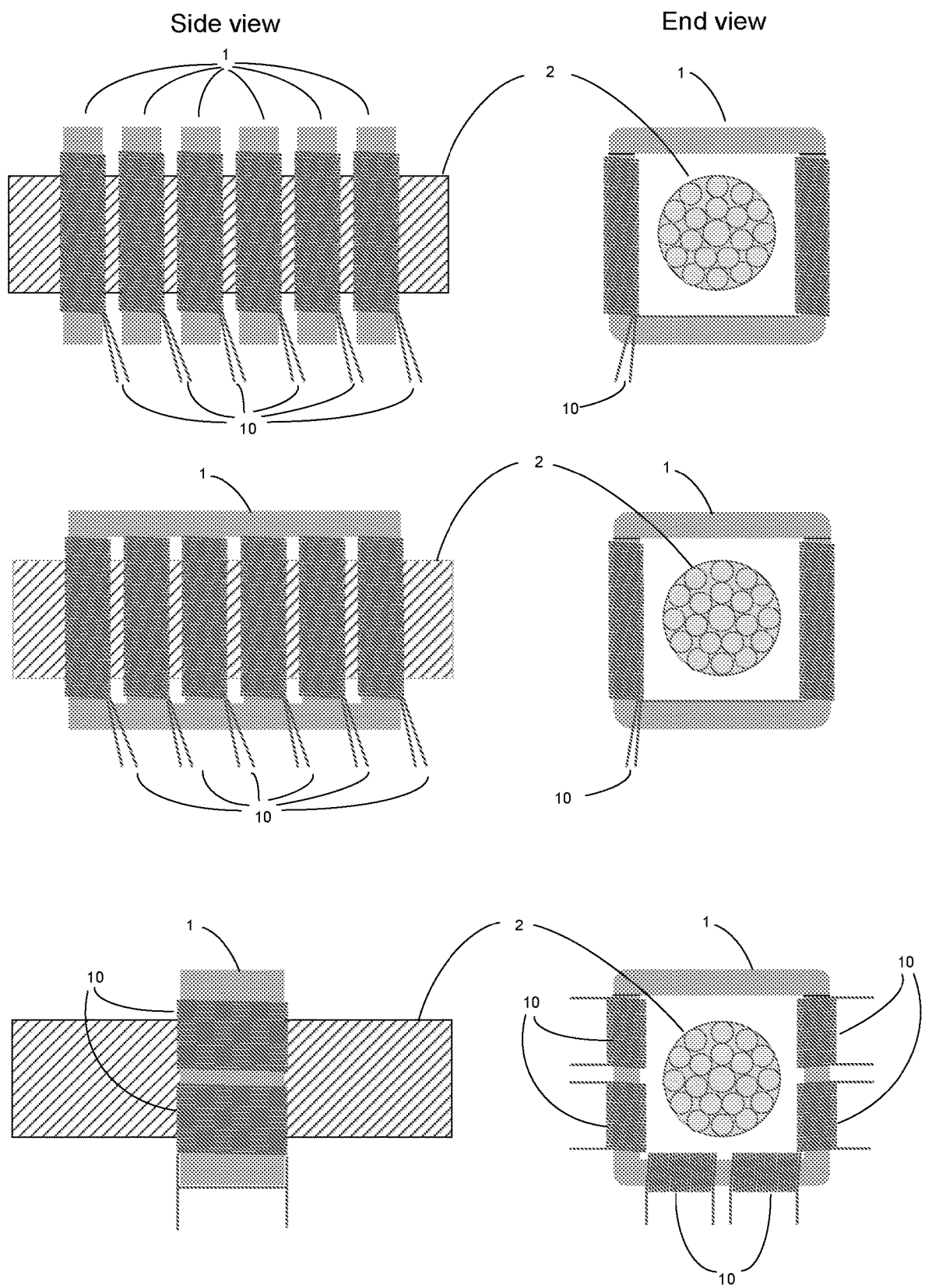
FIG. 1 shows several different configurations of CT cores and windings according to the invention.

Referring to FIG. 1 several examples of an apparatus according to the present invention are shown. A transformer core 1 is placed around a current carrying AC conductor 2, preferably a phase wire. Secondary windings 10 are wound around the transformer core 1. The transformer core 1 can be of any shape as long as it forms a complete loop around the phase wire 2. The secondary windings 10 can be wound around separate transformer cores 1 or around the same transformer core 1 as demonstrated in different embodiments.

Figure 1A:
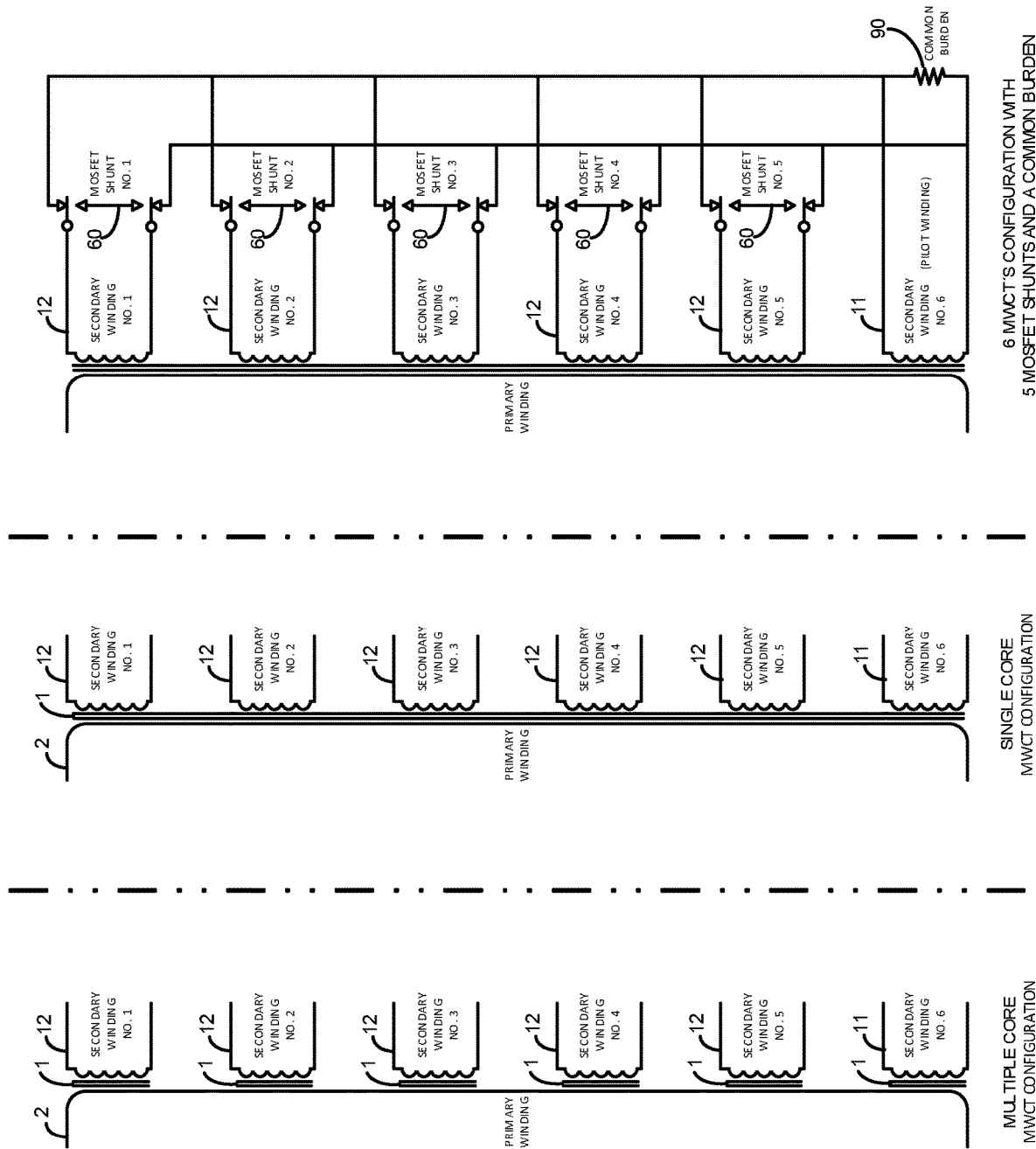
FIG. 1a show several schematic preferred embodiments of a power extracting apparatus according to the invention.

FIG. 1a shows several schematic preferred embodiments of an apparatus according to the invention. The leftmost side shows an arrangement of six secondary windings 10 each wound around their separate core 1. The primary winding or phase wire 1 is also shown. In the middle, an arrangement of six secondary windings 10 sharing the same core 1 is shown. On the rightmost side, the MOSFET-based current shunts 60 are also shown. The base winding 11 does not have a MOSFET shunt 60, since it is never shunted. Each of the shunt secondary windings 12 have their own current shunt 60.

Because of the inherent physics of current transformers and the extreme difficulty in regulating the fluctuating current flow and AC voltage level to a usable DC power, the apparatus power generating system is based on the simple idea of having two or more secondary windings 10 working together forming a joint power generating system. When needed, one or more of those secondary windings 10 are shunted, excluding them from the joint power generation of the secondary windings 10.

The specially designed current transformers of the apparatus have relatively high knee-point core-saturation voltage that gives up to 35 VAC output across the secondary windings depending on the burden presented by the PSU and the external load connected to it. The usable AC voltage range for proper DC rectification lies between 9 and 50 volts AC, more preferably between 12 and 35 volts AC.

Figure 2:
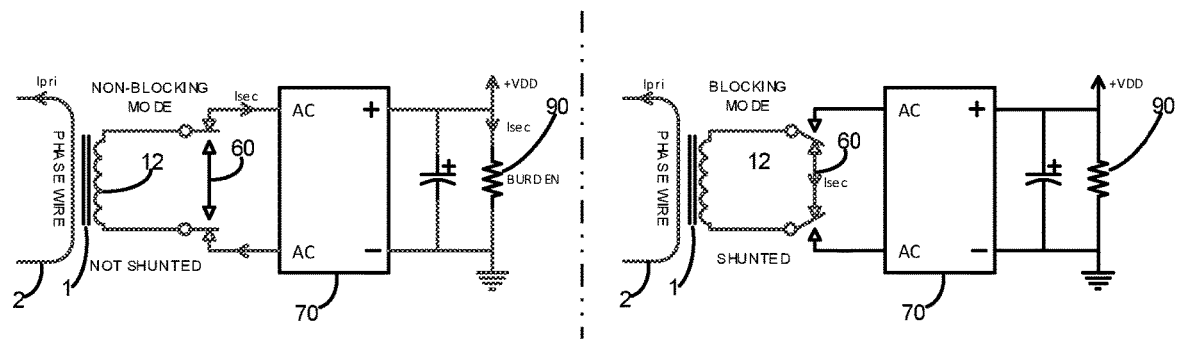
FIG. 2 shows a simplified diagram of a shunting mechanism according to the invention

FIG. 2 demonstrates schematically the shunting of shunt secondary windings. Shunting the shunt secondary windings 12 of a current transformer does not impose any disturbances and it can be said that the normal state of a current transformer is the one where the secondary winding terminals are shorted. The apparatus takes advantage of this fact and uses it for the purpose of voltage and power regulation of the power generating system. FIG. 2 shows a simplified block diagram of the current path of a non-shunted secondary winding and a shunted one. As can be seen on the left hand side of FIG. 2, the shunt secondary winding 12 of the current transformer is connected to the associated rectification bridge 70 and from there to the common burden 90. If, for some reason, the power generation of the apparatus must be limited due to insufficient load on the burden side or an excessive phase wire current, the control logic shunts the secondary winding of that particular transformer as shown on the right hand side of FIG. 2. The shunt circuit inserts very low resistance path between the winding terminals and short circuits the shunt secondary winding 12 so all current generated circulates within the transformer. The voltage level across the secondary winding therefore drops to zero voltage and all power transfer to the associated rectification bridge 70 and the common burden 90 is cut off.

Figure 3:
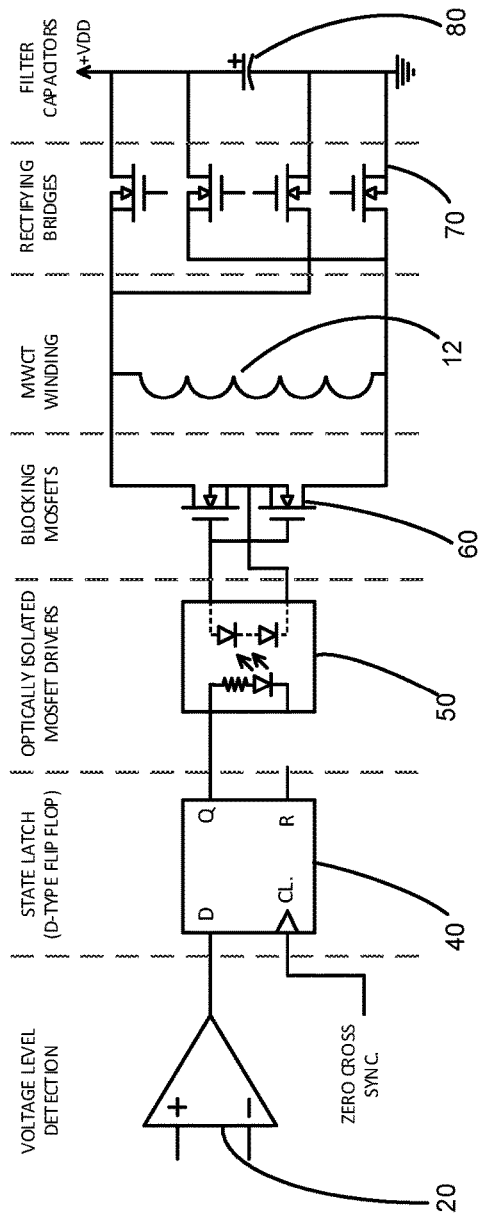
FIG. 3 shows a schematic diagram of a shunt secondary winding regulation and rectification circuit.

FIG. 3 shows an example of a shunt secondary winding regulation and rectification circuit. The circuit consists of a DC voltage level detector 20, a zero cross synchronized status latch 40, a MOSFET current shunt 60, a shunt secondary winding 12, and of a MOSFET based rectification bridge 70 along with smoothing and filtering capacitors 80. Optically isolated MOSFET drivers 50 provide power regulation.

Figure 4:
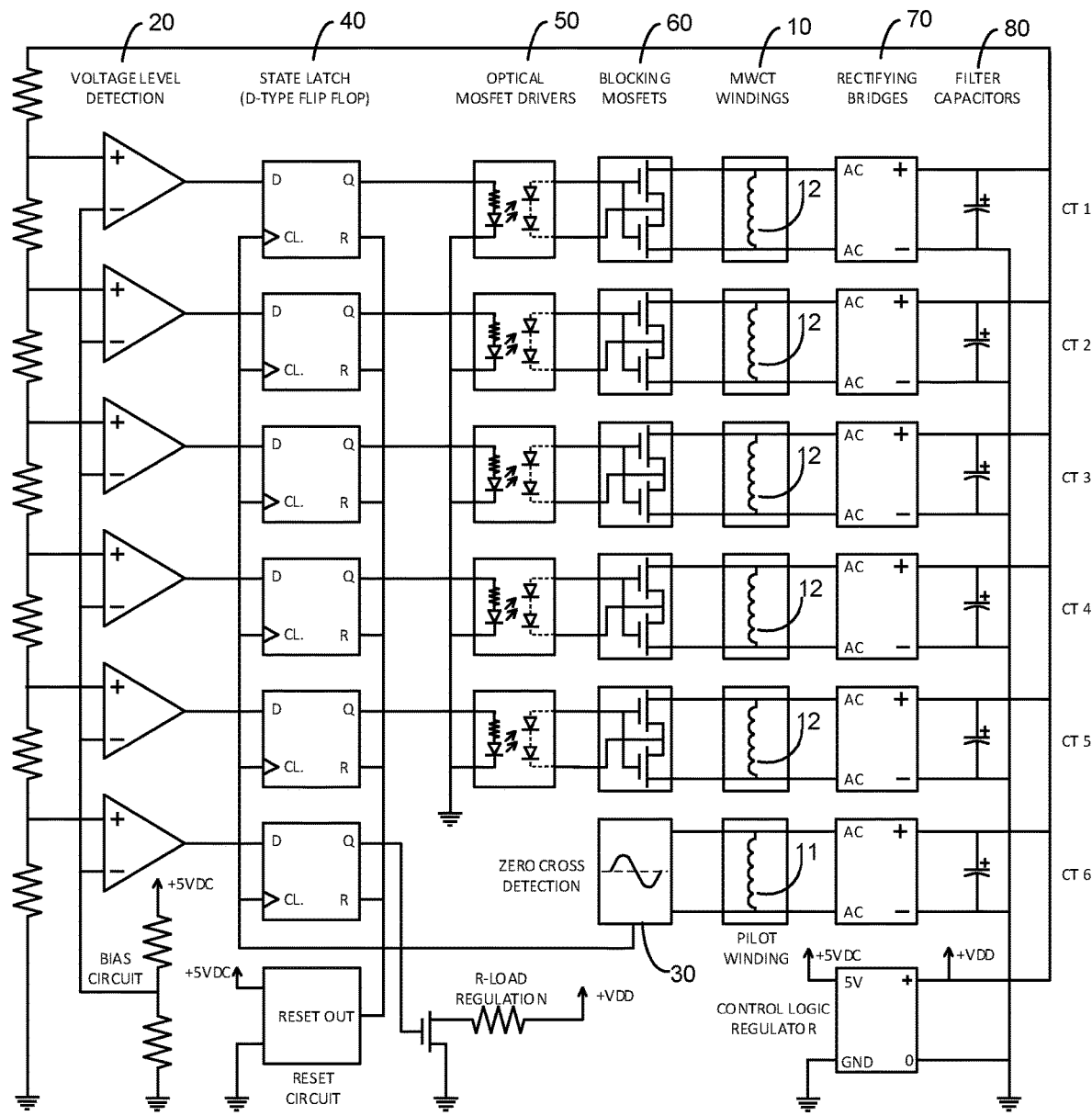
FIG. 4 shows a preferred embodiment of a Multiple Winding Current Transformer (MWCT) module according to the invention.

FIG. 4 shows a preferred embodiment of the MWCT module including one pilot secondary winding 11, five non-pilot secondary windings 12 and their respective regulation and rectification circuits.

The rectification circuitry for the pilot winding does not incorporate MOSFET current shunt 60 like the other rectification circuits but the control logic instead uses pulse width modulated resistive load regulation. The pilot winding also provides the zero crossing detection 30 enabling the DC voltage level status latch 40 to turn the MOSFET current shunts 60 on and off in the zero crossing state of the current transformer, thus minimizing possible voltage spikes generated across the MWCT windings.

Figure 5:
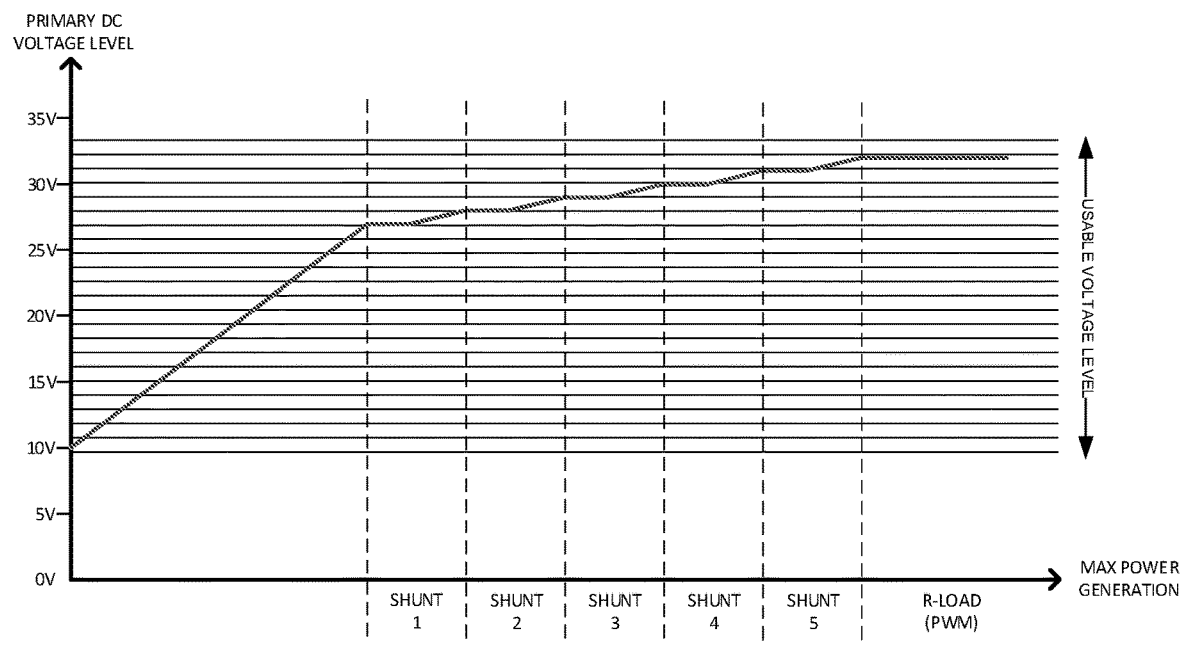
FIG. 5 is a graphical demonstration of the shunting of shunt secondary windings based on the voltage in the apparatus.

FIG. 5 shows a schematic graph illustrating a preferred embodiment of the stepwise shunting of each of the non-pilot secondary windings with the rising voltage. As described before, all the secondary windings 10 contribute to the power generation until the coarse rectified DC voltage rises above a preset limit. As illustrated in the graph in FIG. 5, the control logic shunts one or more of the five non-pilot secondary windings 12 and thereby excludes them from the power generation. As described earlier, the pilot winding 11 is never shunted but instead the control logic uses a pulse width modulated resistive load regulation that kicks in when all the five windings have been shunted and the DC voltage level needs to be limited further to fit within the maximum allowable voltage window.

Figure 6:
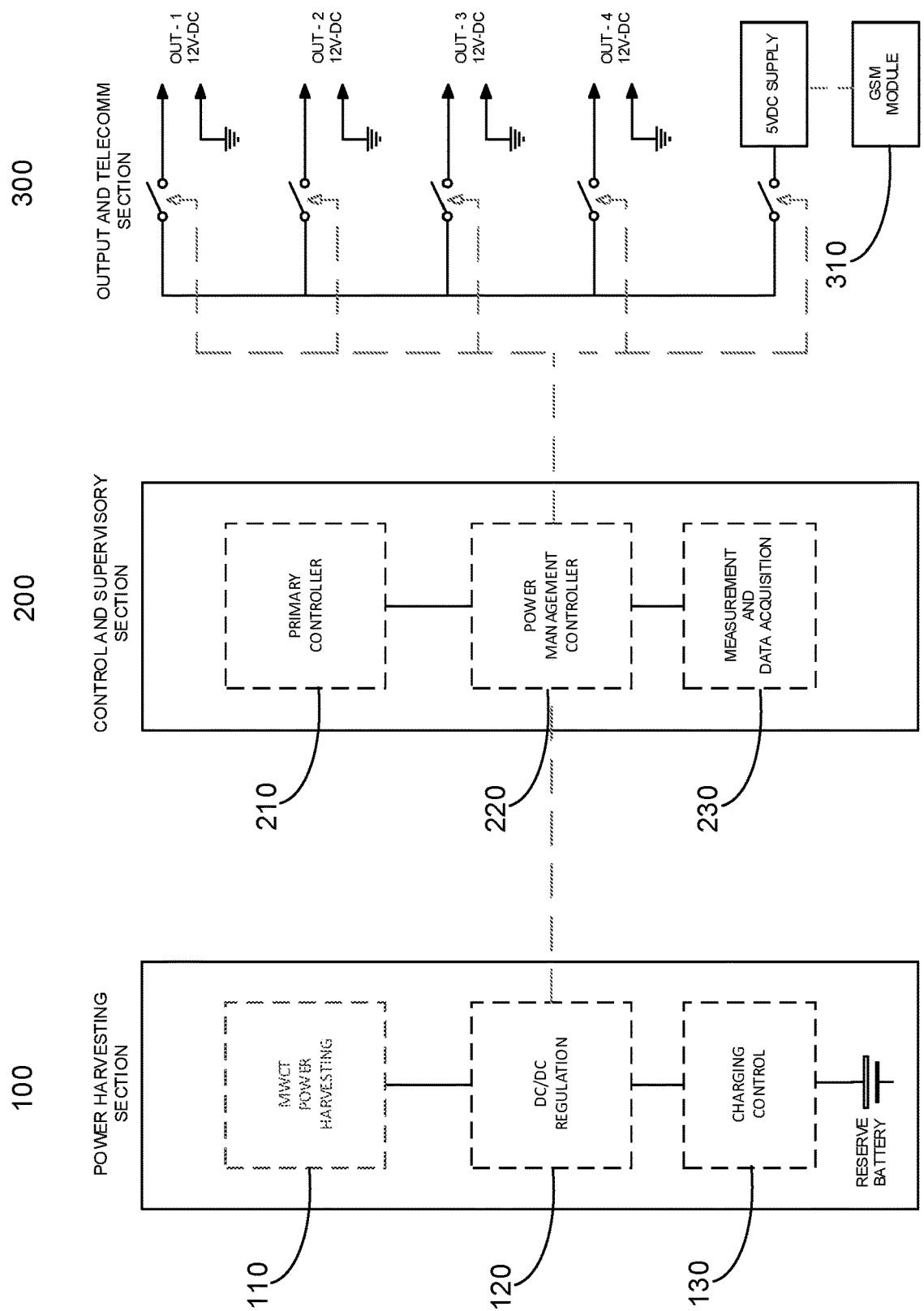
FIG. 6 shows a schematic embodiment of a system for power harvesting, distribution and communication according to the invention.

FIG. 6 shows an embodiment of the power harvesting, distributing and communicating system according to the invention. The Power Management Controller (PMC) 220 controls and supervises the Power Harvesting Section (PHS) 100. The PMC also controls the high side MOSFET circuitry that switches 12 volts DC to external devices connected to the system.

The Primary Controller (PC) 210 communicates with the PMC 220 over a serial communication link and collects measurement data, e.g. current, voltage and temperature values, time stamps them and stores in non-volatile memory for later collection and use. The PC 210 also reads measurement data from the auxiliary circuits of the system and stores in non-volatile memory or sends through the GSM module 310 and mobile network to remote centre.

Among the auxiliary circuits inside the system are real time clock for measurement time stamping, EEPROM for measurement data storage, accelerator sensor for tilt and incline measurements, temperature sensors for system health check, load cell amplifier for use with external tension cell and a universal asynchronous receiver/transmitter. The circuitry inside the system also incorporates a GSM module 310 for wireless telecommunication over the GSM network.

The PHS 100 comprises at least a Multiple Winding Current Transformer (MWCT) module 110, a DC/DC regulation module 120, and a charging control module 130. The CSS 200 comprises at least a primary controller 210, a power management controller 220, and a measurement and data acquisition module 230. The OTS 300 comprises output ports for potential external devices connected to the system and a GSM module 310.

Figure 7:
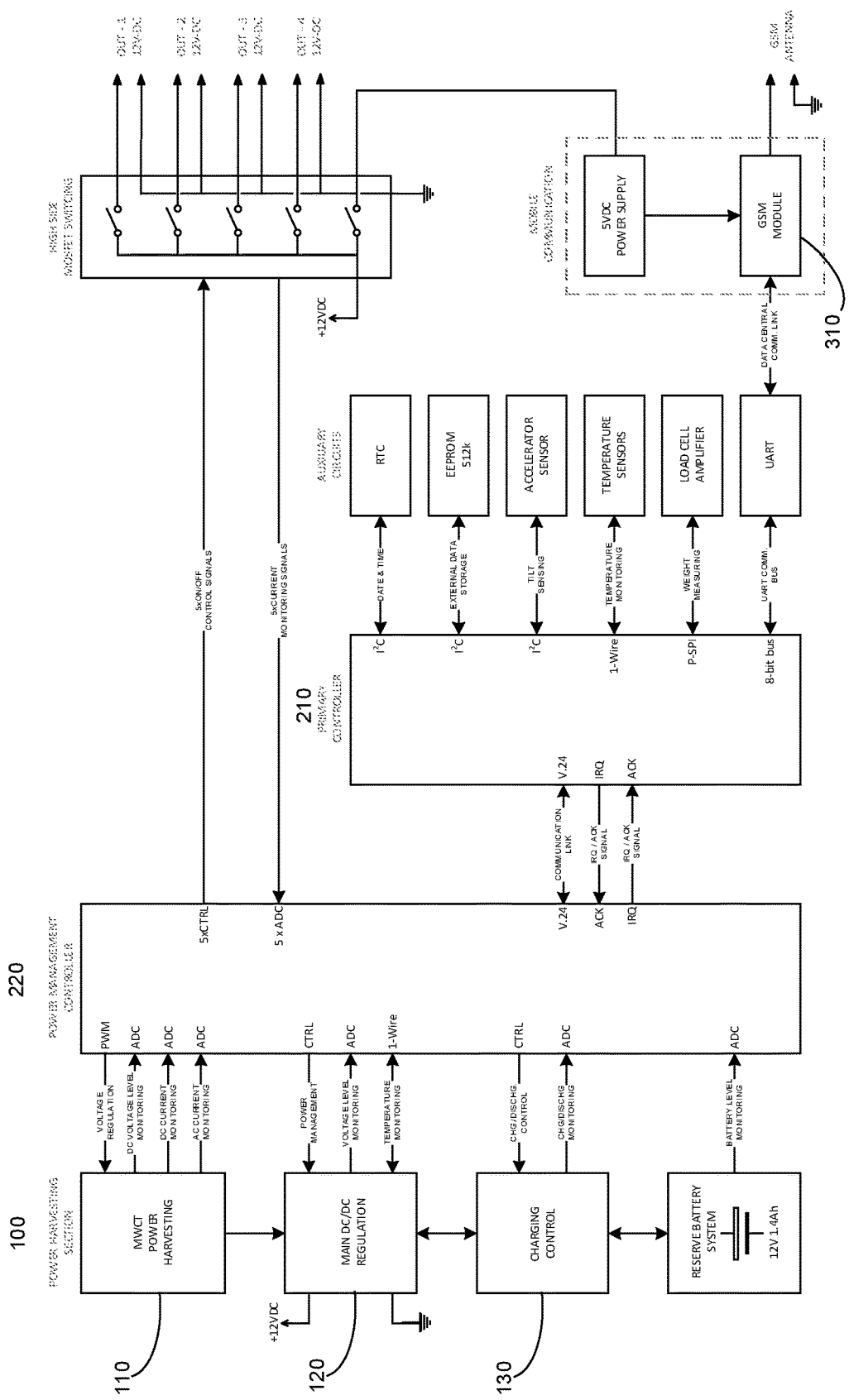
FIG. 7 shows a more detailed embodiment of a system for power harvesting, distribution and communication according to the invention.

FIG. 7 shows a more detailed embodiment of the power harvesting, distributing and communicating system according to the invention. The interaction of different modules and circuits within the system is shown. The PHS 100 comprising the MWCT module 110, the DC/DC regulation module 120, and the charging control module 130 communicate with the power management controller 230 which controls among other things the distribution of DC power. The primary controller 210 communicates with the auxiliary circuits and with the power management controller 220. The GSM module 310 is adapted to wirelessly communicate with devices outside of the system.

Figure 8:
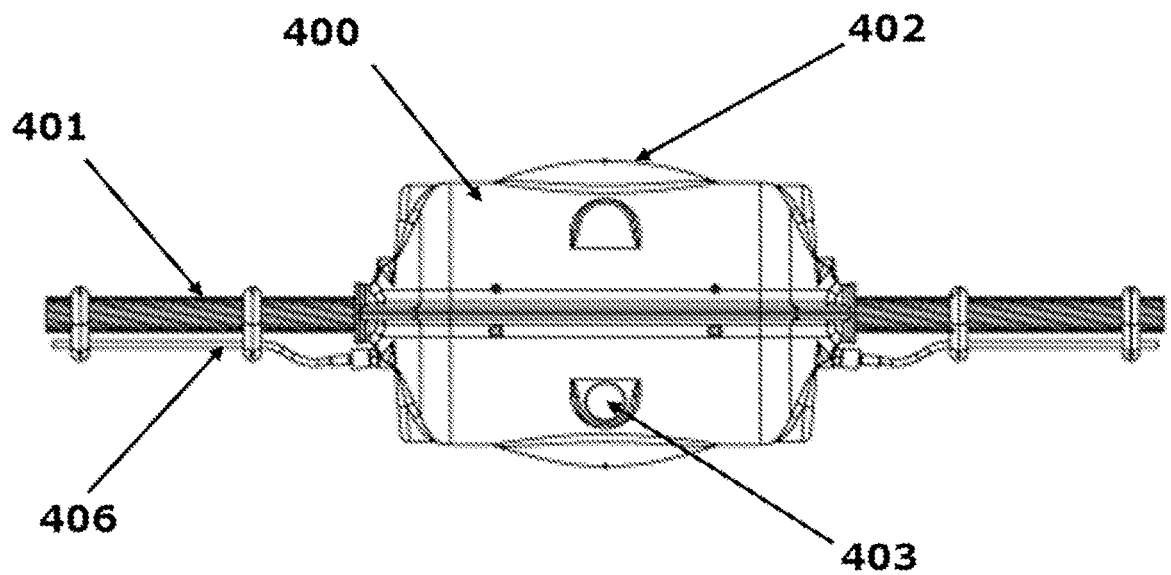
FIG. 8 shows different views on a device in accordance with an embodiments of the present invention.
Figure 8:
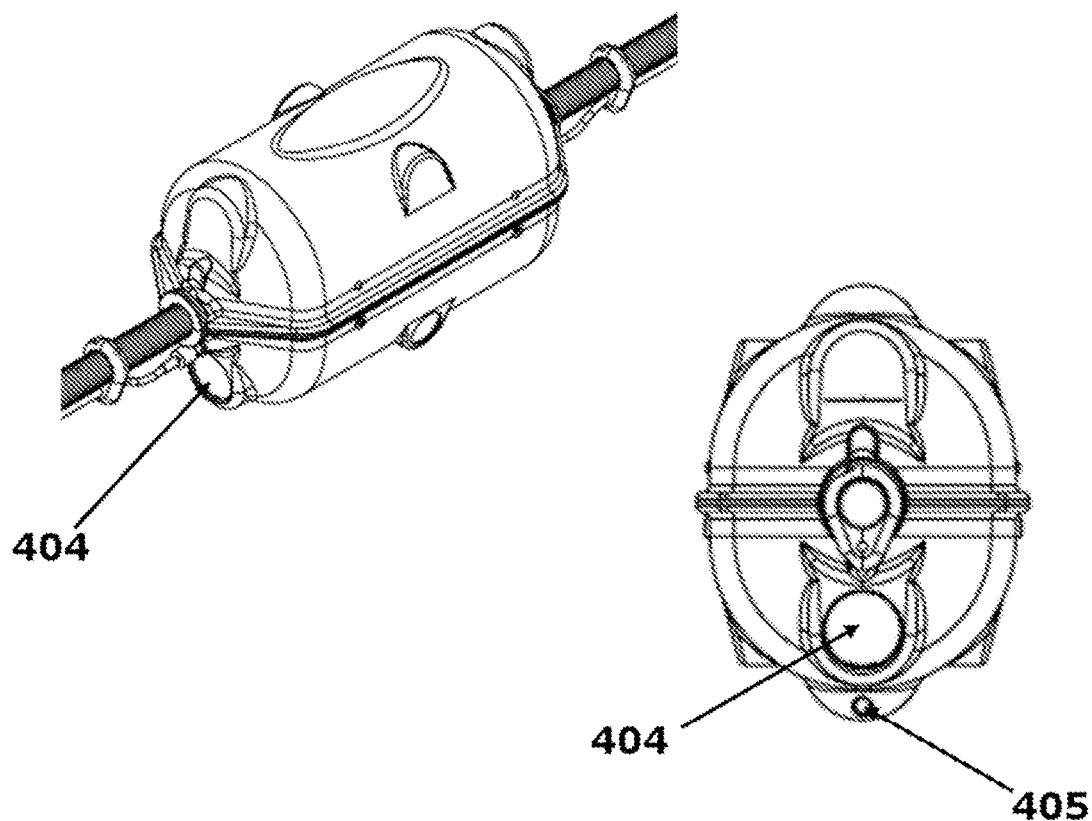

FIG. 8 shows a device according to one embodiment of the present invention. In FIG. 8A, a side view of a casing 400 mounted on a phase wire 401 is shown. The casing 400 has a space in the upper panel of the casing forming a slight protrusion for sensors 402. Extending from the lower portion of the casing under the opening for the phase wire is a connector for a load cell 403. On the side of the casing is a window for a camera to obtain images from the surrounding of a power line. In FIG. 8B and FIG. 8 C a front and perspective view of the casing shows camera windows 404 for cameras which provide images along the phase wire. Below the camera window 404 a splash proof air inlet/outlet 405 is shown.

Figure 9:
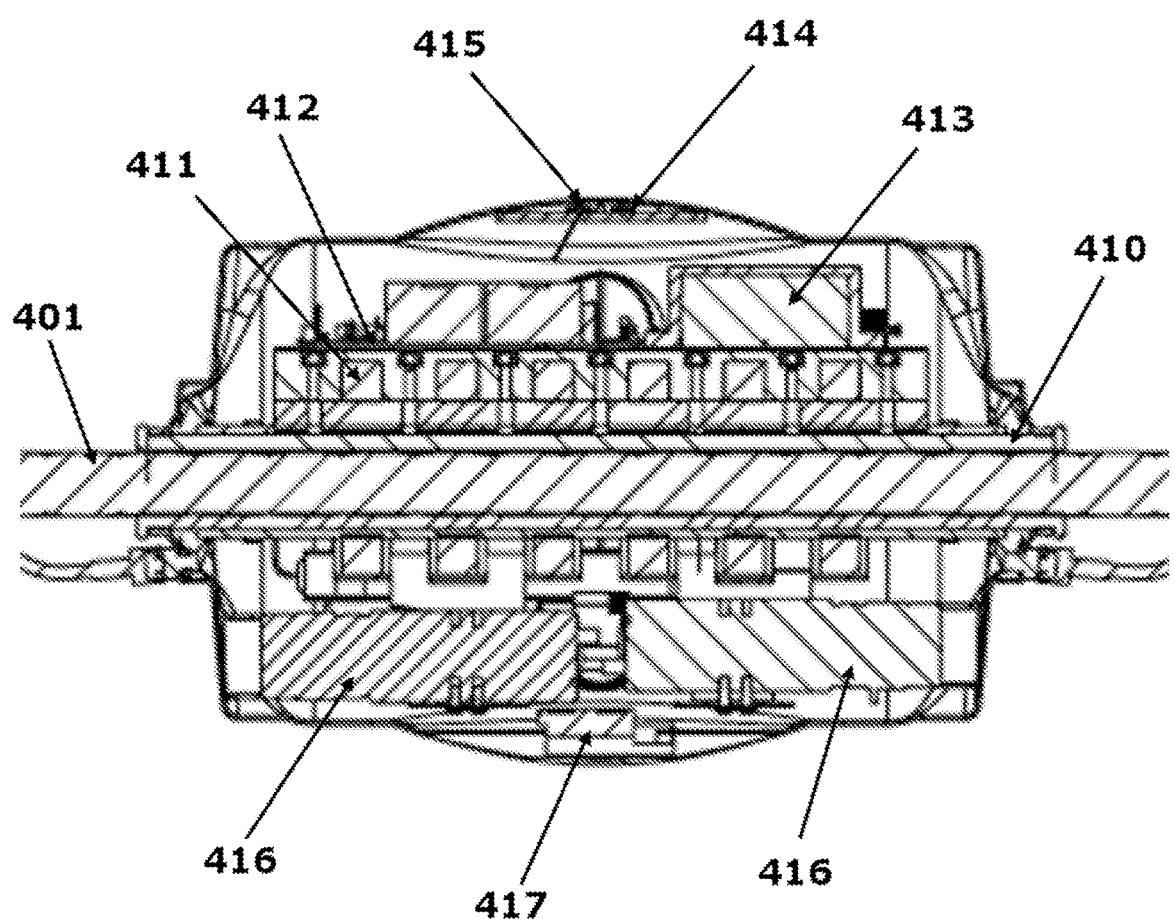
FIG. 9 shows a cross sectional view across an embodiment of a device of the present invention.

FIG. 9 is a transactional view of a device according to one embodiment of the present invention. The device is clamped around a phase wire 401 and the figure shows a rubber insulation 410 around the phase wire. A row of six current transformers 411 are shown clamped around the phase wire. A printed circuit board 412 is shown above the current transformers on the left side of the drawing and on the right side a communication modem 413 is shown. An outside temperature sensor 414 and salinity sensor 415 are shown in the protrusion in the top panel of the casing. In the lower part of the casing, two cameras 416 are shown directed along the phase wire 401 in both directions. A ventilation fan 417 is shown underneath the cameras.

EXAMPLES

Example 1. Testing the Power Harvesting Capabilities and Power Output Quality of the Apparatus of the Present Invention (POLG—Power On-Line Generator), Type 300A The main objective of the test was to confirm the power harvesting capabilities of the Power On-Line Generator (POLG).

Table 1 shows a list and description of measurement equipment used during the testing.

TABLE 1

| Name of equipment | Description |
| --- | --- |
| Omicron CPC100 & Booster Unit (Phase Conductor Circuit) | Type: CPC100<br>Option: A. V1<br>Serial Number: MF163T<br>Input: 100-240 V/50/60 Hz/16 A<br>Output: max 2000 V or 800 A |

TABLE 1-continued

| Name of equipment | Description |
|---|---|
| Tektronix TDS 220 Oscilloscope | TDS 220 Two Channel Digital Real-Time Oscilloscope 100 MHz-1 GS/s |
| Fluke 187 TRUE RMS MULTIMETER | Fluke MULTIMETER |
| Ampmeter/Multimeter (Digital) | NIEF Instruments NI30 AC/DC Clamp Multimeter |

Figure 10:
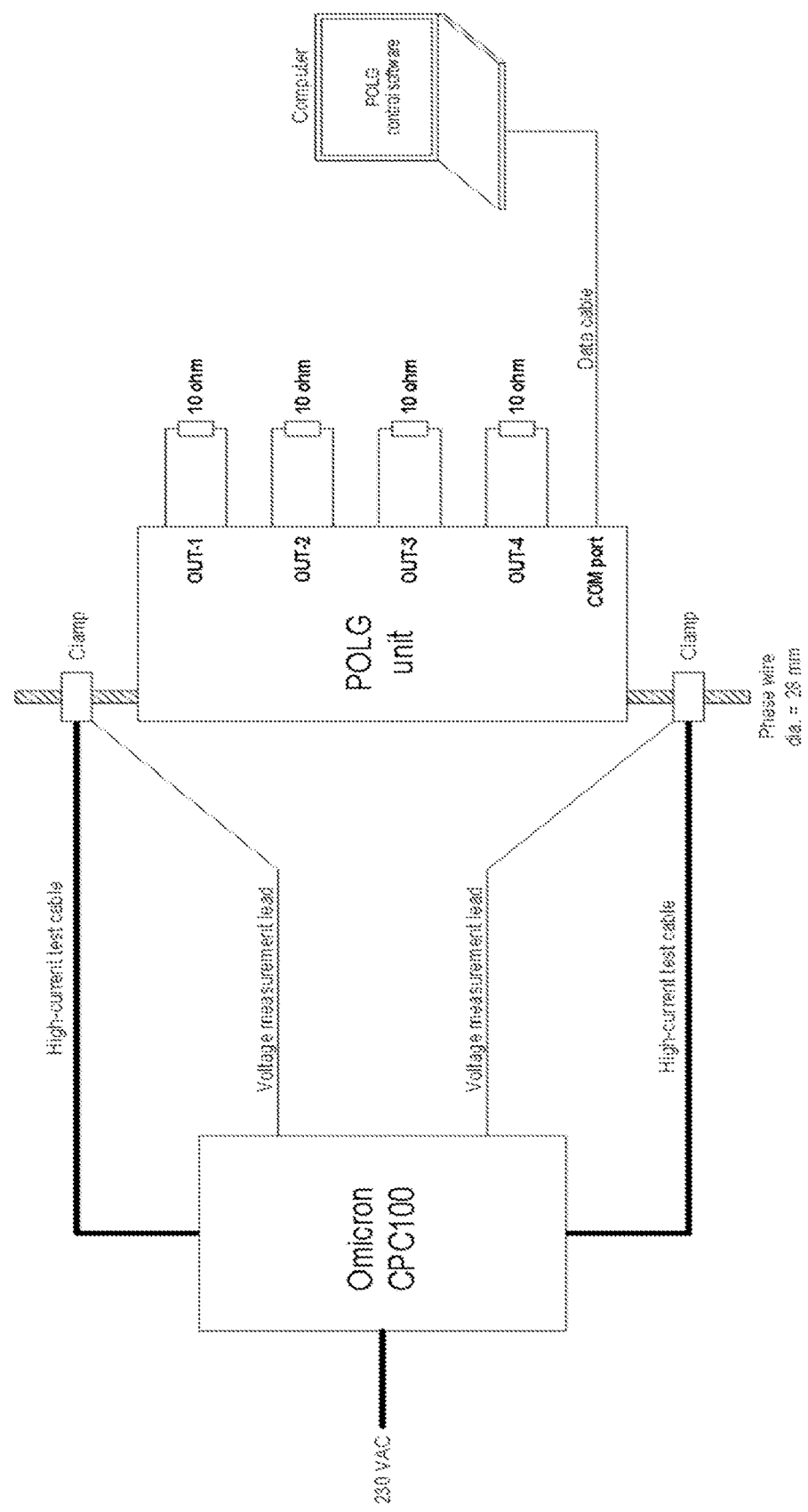
FIG. 10 shows the Omicron Multi-functional test system used for testing the device of the invention.

The Omicron CPC100 Multi-functional test system was used as a current generator for simulating current flow through a phase wire stub passing through the POLG unit. The Omicron Multi-functional test system was also used for voltage measurement across the phase wire stub. See FIG. 10.

The test process was performed such that the Omicron CPC100 current generation started at 400 A and all outputs of the POLG units were turned on by sending commands from control computer to the POLG unit through a serial data link. Current generation was gradually lowered until the control circuitry on-board the POLG unit turned the four outputs off one by one according to the available power budget. See Table 2.

TABLE 1

Power out vs. primary current

| Primary current | Output 1 12 VDC | Output 2 12 VDC | Output 3 12 VDC | Output 4 12 VDC | Effective output power |
|---|---|---|---|---|---|
| above 183A | On | On | On | On | 57, 6 W |
| above 134A | On | On | On | Off | 43, 2 W |
| above 90A | On | On | Off | Off | 28, 8 W |
| above 38A | On | Off | Off | Off | 14, 4 W |
| below 37A | Off | Off | Off | Off | 0, 0 W |

The power output turn on and turn off properties of the POLG unit were also tested. For the purpose of protecting sensitive devices from power surges the POLG unit has to supply clean and stable 12 VDC power outputs. This includes securing instantaneous and de-bounced power on and power off characteristics of the power outputs.

Figure 11:
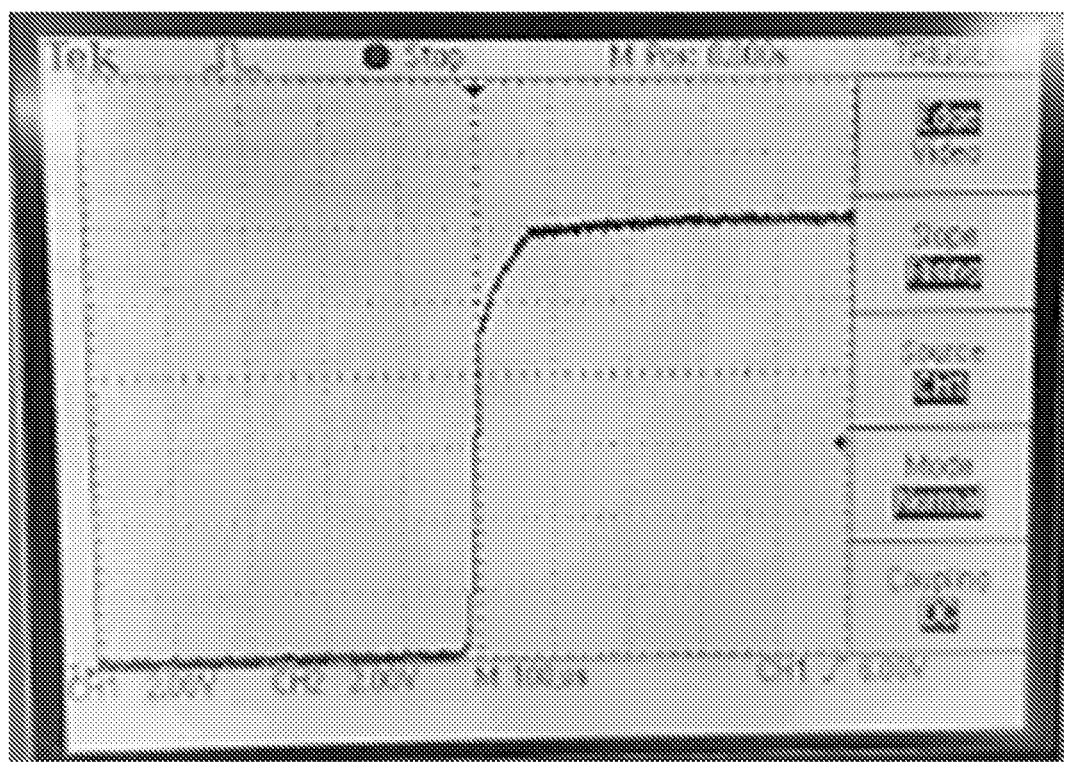
FIG. 11 shows an oscilloscope measurements of the turn-on and turn-off properties in an experiment using the POLG.
Figure 11:
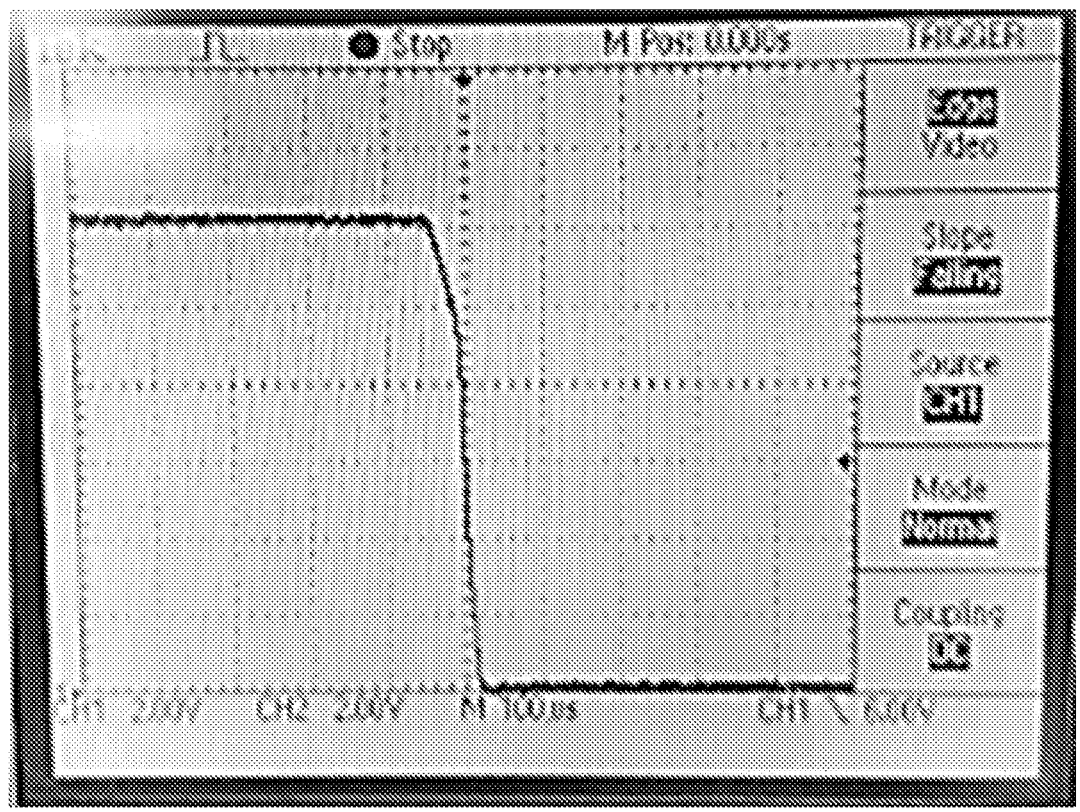

FIG. 11A shows an oscilloscope measurements of the turn-on properties of one of the POLG power output and FIG. 11B shows the turn-off properties of that same output. As can be seen from the scope measurements, it takes the output within 100 microseconds to go from 0-12 VDC (turning the output on). This same applies when going from 12-0VDC (turning the output off). The test run showed that the output turning on into 10-ohm load—rise time from 0VDC to 12 VDC was approximately 90 microseconds (FIG. 11A), whereas the output turning off from 10-ohm load—fall time from 12 VDC to 0VDC was approximately 80 microseconds.

As used herein, including in the claims, singular forms of terms are to be construed as also including the plural form and vice versa, unless the context indicates otherwise. Thus, it should be noted that as used herein, the singular forms "a," "an," and "the" include plural references unless the context clearly dictates otherwise.

Throughout the description and claims, the terms "comprise", "including", "having", and "contain" and their variations should be understood as meaning "including but not limited to", and are not intended to exclude other components.

The present invention also covers the exact terms, features, values and ranges etc. in case these terms, features, values and ranges etc. are used in conjunction with terms such as about, around, generally, substantially, essentially, at least etc. (i.e., "about 3" shall also cover exactly 3 or "substantially constant" shall also cover exactly constant).

The term "at least one" should be understood as meaning "one or more", and therefore includes both embodiments that include one or multiple components. Furthermore, dependent claims that refer to independent claims that describe features with "at least one" have the same meaning, both when the feature is referred to as "the" and "the at least one".

It will be appreciated that variations to the foregoing embodiments of the invention can be made while still falling within the scope of the invention. Alternative features serving the same, equivalent or similar purpose can replace features disclosed in the specification, unless stated otherwise. Thus, unless stated otherwise, each feature disclosed represents one example of a generic series of equivalent or similar features.

Use of exemplary language, such as "for instance", "such as", "for example" and the like, is merely intended to better illustrate the invention and does not indicate a limitation on the scope of the invention unless so claimed. Any steps described in the specification may be performed in any order or simultaneously, unless the context clearly indicates otherwise.

All of the features and/or steps disclosed in the specification can be combined in any combination, except for combinations where at least some of the features and/or steps are mutually exclusive. In particular, preferred features of the invention are applicable to all aspects of the invention and may be used in any combination.

The invention claimed is:

1. An apparatus adapted to extract power from an alternating current carrying conductor's magnetic field comprising:
   a) at least one transformer core adapted to be placed all the way around the alternating current carrying conductor; and
   b) at least two secondary windings wound around the at least one transformer core wherein the first secondary winding is a base secondary winding wherein the base winding comprises a variable resistive load adapted to be adjusted based on a voltage across the apparatus.

2. An apparatus according to claim 1 wherein the transformer core and/or cores are of a circular, square, elliptical and/or other shapes and form(s) a closed loop for the alternating magnetic field surrounding the alternating current carrying conductor.

3. An apparatus according to claim 1 wherein the base secondary winding and each of the shunt secondary windings are part of their own rectification circuit and are all together part of the larger power and voltage regulation circuit.

4. An apparatus according to claim 3 wherein the regulation and rectification circuit comprises a base secondary winding or a shunt secondary winding, a common DC voltage level detector for the regulated and rectified DC voltage, a zero crossing detector, an AC voltage zero crossing controlled circuit status latch, an optically isolated MOSFET driver and a blocking MOSFET for each of the at least one shunt secondary windings and a MOSFET-based rectifying bridge with smoothing and filtering capacitors for the base winding and for each of the at least one shunt secondary windings.

5. An apparatus according to claim 4 wherein the shunt secondary windings are adapted to be shunted using the MOSFET current shunt that is a part of the power and voltage regulation circuit when the voltage across the apparatus exceeds a certain pre-set value.

6. An apparatus according to claim 4 wherein the use of MOSFET transistors featuring ultra-low RDS-on (ultra-low Drain to Source resistance) minimizes power losses and heat generation within the apparatus.

7. An apparatus according to claim 4 wherein the rectifying bridges are connected in parallel.

8. An apparatus according to claim 1 wherein the base resistance for the variable resistive load is 1-10 ohms, more preferably 1-4.7 ohms.

9. An apparatus according to claim 1, wherein the apparatus is adapted to deliver a direct current output.

10. An apparatus according to claim 1, wherein the apparatus is adapted to deliver an average of 30 to 100 watts as an output, preferably 50 to 70 watts, when the current carrying conductor carries an average of 100 to 1500 A, such as 200 A.

11. An apparatus adapted to extract power from an alternating current carrying conductor's magnetic field comprising:
   a) a base winding adapted to contribute to power generation; and
   b) at least one shunt secondary winding adapted to contribute to the power generation; and
   c) a common DC voltage level detector for regulated and rectified DC voltage; and
   d) a zero crossing detector; and
   e) an AC voltage zero crossing controlled circuit status latch; and
   f) an optically isolated MOSFET driver and a blocking MOSFET for each of the at least one shunt secondary windings; and
   g) a MOSFET-based rectifying bridge with smoothing and filtering capacitors for the base winding and for each of the at least one shunt secondary windings wherein the base winding is adapted to provide power for the analog and control logic and the zero crossing detector.

12. An apparatus according to claim 11 further comprising at least one transformer core around which the primary and the at least one secondary windings are wound wherein the transformer core is of a circular, square, elliptical and/or other shapes and forms a closed loop for the alternating magnetic field surrounding the alternating current carrying conductor.

13. An apparatus according to claim 12 wherein the shunt secondary windings are adapted to be shunted using the blocking MOSFET that is a part of a voltage regulation circuit when the voltage across the apparatus exceeds a certain preset value.

14. An apparatus according to claim 12 wherein the use of MOSFET transistors featuring ultra-low RDS-on (ultra-low Drain to Source resistance) minimizes power losses and heat generation within the apparatus.

15. An apparatus according to claim 12, wherein the apparatus is adapted to deliver a direct output current (DC).

16. An apparatus according to claim 12, wherein the apparatus is adapted to deliver an average of 30 to 100 watts as an output, preferably 50 to 70 watts, when the current carrying conductor carries an average of 100 to 1500 A, such as 200 A.

17. An apparatus according to claim 11 wherein the rectifying bridges are connected in parallel.

18. A system adapted to extract power from an alternating current carrying conductor's magnetic field and use it for at least powering itself comprising:
   a) a Power Harvesting Section (PHS) adapted to extract power from a magnetic field of the alternating current carrying conductor while located in the proximity of said conductor wherein the PHS is adapted to convert the generated current from alternating (AC) to direct (DC); and
   b) a Control and Supervisory Section (CSS) adapted to receive and send data related to technical parameters of the system from the PHS, store this data and make decisions based on the values of certain technical parameters; and
   c) an Output and Telecom Section (OTS) adapted to convert voltage incoming from the PHS for any external devices connected to the system and to communicate wirelessly with devices outside of the system via a communication module.

19. A system according to claim 18, further comprising auxiliary circuits adapted to measure temperature, acceleration (tilt), and/or cell load (weight) within the system and/or within the alternating current carrying conductor.

20. A system according to claim 19 weighting a total of 15-30 kg, more preferably 15-25 kg, even more preferably 15-20 kg.

21. A system according to claim 19 adapted to extract an average of 30-100 watts, more preferably 40-80 watts, even more preferably 50-70 watts from a phase wire with an average current value of 100-1500 A.

22. A system according to claim 19 adapted to induce an AC voltage of 9-50 V, more preferably 9-35 V from the phase wire.

23. A system according to claim 19 wherein the PHS comprises at least a Multiple Winding Current Transformer (MWCT) module, a DC/DC regulation module and a charging control module.

24. A system according to claim 23 wherein the MWCT module comprises at least two secondary windings around at least one transformer core that is itself placed around the alternating current carrying conductor.

25. A system according to claim 24 wherein the first secondary winding is a base winding further comprising a variable resistive load adapted to be adjusted based on the voltage across the system.

26. A system according to claim 25 wherein the base resistance for the variable load is 1-10 ohms, more preferably 1-4.7 ohms.

27. A system according to claim 26 wherein the base winding and each of the at least one shunt secondary windings are part of their own rectification circuit and are all together part of a larger power and voltage regulation circuit.

28. A system according claim 27 wherein the regulation and rectification circuit comprises a common DC voltage level detector, an AC voltage zero crossing detector, a synchronized circuit status latch, a MOSFET current shunt, a MWCT winding, and a MOSFET based rectification bridge with smoothing and filtering capacitors.

29. A system according to claim 28 wherein the MOSFET current shunt is adapted to shunt the shunt secondary winding if the voltage exceeds a certain pre-set value.

30. A system according to claim 29 wherein the rectification bridge uses MOSFET transistors featuring ultra-low RDS-on (ultra-low Drain to Source resistance) minimizing power losses and heat generation within the apparatus.

31. A system according to claim 30 wherein the PHS is adapted to control shunting of the shunt secondary windings and the variable load of the base winding based on the voltage reading across the system.

32. A system according to claim 25 wherein the rectifying bridges are connected in parallel.

33. A system according to claim 19 wherein the CSS comprises at least a primary controller, a power management controller and a measurement and data acquisition module.

34. A system according to claim 33 wherein the power management controller is adapted to distribute the converted DC power to other elements of the system such as the OTS.

35. A system according to claim 19 wherein the communication module of the OTS section comprises a GSM module for wireless communication.

36. A system according claim 19 further adapted to connect to external measurement devices and/or surveillance devices that can then be powered with the harvested power through the OTS section.

37. A system according to claim 19, wherein the apparatus is adapted to deliver a direct output current.

38. A power line system comprising the system according to claim 19 and a power line as the alternating current carrying conductor.

39. The power line system according to claim 38, wherein the power line is an overhead and/or a buried power line.

40. A method of harvesting electrical power from an alternating current carrying conductor claim comprising the steps of:
  a) placing at least one transformer core around the alternating current carrying conductor and winding at least two secondary windings around the at least one transformer core, wherein a first secondary winding is a base winding and the other secondary windings are shunt secondary windings; and
  b) providing a variable resistive load for the base secondary winding adapted to increase or decrease the load depending on a voltage level; and
  c) providing a shunting mechanism for each shunt secondary winding adapted to short the secondary winding if the voltage level reaches a certain pre-set value; and
  d) converting the power harvested from the alternating current carrying conductor into DC power.

41. A method according to claim 40 further comprising the following steps:
  e) using the harvested power to monitor and/or store technical parameters of the circuit and/or of the alternating current carrying conductor; and
  f) sending the technical parameters wirelessly and receiving commands wirelessly over a communication module.

42. A method according to claim 41 wherein the technical comprise time stamped temperature data, acceleration and/or tilt data, cell load or weight data and/or other circuit related parameters.

43. A method according to claim 42 wherein the shunting mechanism comprises MOSFET transistors featuring ultra-low RDS-on (ultra-low Drain to Source resistance) that may minimize power losses and heat generation.

44. A method according to claim 42 wherein converting the AC power to DC power is achieved via a MOSFET-based rectification circuit, which may be adapted to minimize voltage drops and power losses across the circuit.

45. A method according to claim 42 wherein the base resistance is 1-10 ohms, more preferably 1-4.7 ohms.

46. A method according to claim 42 wherein the rectifying bridges are connected in parallel.

* * * * *